United States Patent
Yamamoto et al.

[11] Patent Number: 5,304,602
[45] Date of Patent: * Apr. 19, 1994

[54] PROCESS FOR PRODUCING SINTERED CERAMIC WIRE

[75] Inventors: Susumu Yamamoto; Teruyuki Murai; Nozomu Kawabe; Shuji Yazu; Tetsuji Jodai, all of Hyogo, Japan

[73] Assignee: Sumitomo Electric Industries, Ltd., Osaka, Japan

[*] Notice: The portion of the term of this patent subsequent to Mar. 6, 2007 has been disclaimed.

[21] Appl. No.: 182,489

[22] Filed: Apr. 18, 1988

[30] Foreign Application Priority Data

Apr. 16, 1987 [JP] Japan .................................. 62-93972
May 2, 1987 [JP] Japan .................................. 62-109417

[51] Int. Cl.$^5$ ...................... H01L 39/12; H01L 39/24
[52] U.S. Cl. ...................... 505/433; 29/599; 264/60; 264/61; 505/740
[58] Field of Search ............... 505/740, 822, 915, 930, 505/1; 264/56, 61, 66, 60; 29/599

[56] References Cited

U.S. PATENT DOCUMENTS

| | | |
|---|---|---|
| 3,124,455 | 3/1964 | Buehler .................... 428/558 |
| 3,932,315 | 1/1976 | Sleight .................... 252/521 |
| 4,604,146 | 8/1986 | Aida et al. .................... 148/12 B |
| 4,704,249 | 11/1987 | Glatzle .................... 419/4 |
| 4,906,609 | 3/1990 | Yamauchi et al. .................... 505/1 |
| 5,114,641 | 5/1992 | Yamamoto et al. .................... 264/61 |

FOREIGN PATENT DOCUMENTS 60-173885 9/1985 Japan .
61-131307 11/1987 Japan .

OTHER PUBLICATIONS

Yamada et al. "Bulk and Wire Type Y-Ba-Cu Oxide Superconductor" *Jap Journ of App Phys* Mar. 1987.
Jin et al. "High Tc ... Fabrication" *Applied Phys Letters* preprint (Apr. 13, 1987).
Yamada et al. "Critical ... Superconductor" *Jap Journ App Phys* preprint Apr. 15, 1987.
"Superconducting Wires of High Tc Oxides" by Ohmatso et al. (Acc No. 01166) 1987.
"Phase Compatibilities in the System $Y_2O_3$-BaO-CuO at 950° C." by Frase et al. *Communications of the American Ceramic Society* Apr. 7, 1987 (To appear Sep. 1987).
"Problems in Production of $YBa_2Cu_3O_x$ Superconducting Wire" by McCallum et al. *Advanced Ceramics Materials (1987)*.
J. G. Bednorz et al. "Possible High Tc Superconductivity in the Ba-La-Cu-O System" Z. PhysB—Condensed Matter pp. 189–193 (1986).

*Primary Examiner*—Jan H. Silbaugh
*Assistant Examiner*—Christopher A. Fiorilla
*Attorney, Agent, or Firm*—Kerkam, Stowell, Kondracki & Clarke

[57] ABSTRACT

A process for producing a sintered ceramic wire, particularly a superconducting wire, by the steps of filling a metal pipe with a material powder of ceramic, wire drawing the metal pipe filled with the material powder by means of roller dies and then subjecting a composite of the metal pipe and the material powder to a heating operation to sinter the ceramic powder.

18 Claims, 1 Drawing Sheet

PROCESS FOR PRODUCING SINTERED CERAMIC WIRE

BACKGROUND OF THE INVENTION

1. Field of the Invention

The present invention relates to a process for producing an elongated wire material of sintered ceramics; more particularly, it relates to an improvement in a process for producing a wire material which permits the use of a sintered body composed of superconducting compound oxide which exhibits a higher critical temperature of superconductivity.

2. Description of the related art

Under the superconducting condition, the perfect diamagnetism is observed, and no difference in potential is observed so that an electric current of a constant finite value is observed internally, and hence, a variety of applications of superconductivity has been proposed in a field of electric power transmission as a mean for delivering electric power without loss.

The superconductivity can be utilized in the field of power electric applications, such as MHD power generation, power transmission, electric power reservation or the like; in the field of transportation, such as magnetic levitation trains or magnetically propelling ships; a highly sensitive sensors or detectors for sensing very weak magnetic field, microwave, radiant ray or the like; in the medical field such as high-energy beam radiation unit; in the field of science, such as NMR or high-energy physics; or in the field of fusion power generation.

In addition to the above-mentioned power electric applications, the superconducting materials can be used in the field of electronics, for example, as a Josephson device, which is an indispensable switching device for realizing a high-speed computer which consumes very reduced power.

However, their actual usage has been restricted because the phenomenon or superconductivity can be observed only at very low cryogenic temperatures. Among known superconducting materials, a group of materials having so-called A-15 structure shows rather higher Tc (critical temperature of superconductivity) than others, but even the top record of Tc in the case of $Nb_3Ge$, which showed the highest Tc, could not exceed 23.2K at most. This means that liquidized helium (boiling point of 4.2K) is only one cryogen which can realize such very low temperature of Tc. However, helium is not only a limited costly resource but also requires a large-scaled system for liquefaction. Therefore, there has been a strong demand for another superconducting materials having higher Tc. But no materials which exceeded the above-mentioned Tc had been found in studies for the past ten years.

It has been known that certain ceramics material of compound oxides exhibits the property of superconductivity. For example, U.S. Pat. No. 3,932,315 discloses Ba-Pb-Bi type compound oxide which shows superconductivity, and Japanese patent laid-open No. 60-173,885 discloses that Ba-Bi type compound oxides also show superconductivity. These type superconductors, however, possess a rather lower transition temperature of about 10k, and hence usage of liquidized helium (boiling point of 4.2K) as cryogen is indispensable to realize superconductivity.

Possibility of existence of a new type of superconducting materials having much higher Tc was revealed by Bednorz and Müller who discovered a new oxide type superconductor in 1986 [Z. Phys. B64 (1986)189]

This new oxide type superconducting material is [La, Ba]$_2$CuO$_4$ or [La,Sr]$_2$CuO$_4$ which is known as the K$_2$NiF$_4$-type oxide having a crystal structure which is similar to known perovskite type oxide. The K$_2$NiF$_4$-type oxides show is much higher Tc as 30K than the known superconducting materials, and hence it becomes possible to use liquidized hydrogen (b.p.=20.4K) or liquidized neon (b.p.=27.3K) as a cryogen which bring them to exhibit the superconductivity.

It was also reported in the newspaper that C. W. Chu et al discovered in the United States of America another type of superconducting material having the critical temperature of in the order of 90K in February 1987, and hence possibility of existence of high-temperature superconductors has burst on the scene.

However, the above-mentioned new type of superconducting materials just born has been studied and developed only in a form of sintered bodies as a bulk produced from powders but has not been tried to be shaped into a wire form. The reason is that the new type superconductors are ceramic materials of compound oxide which do not possess enough plasticity or process-ability in comparison with well-known metal type superconducting materials such as Ni-Ti alloy, and, therefore, they cannot or are difficult to be shaped or formed into an elongated article such as a wire by a conventional technique, such as wire-drawing, in which superconducting metal is drawn directly or in embedded condition in copper into a wire form.

It is proposed in Japanese patent laid-open No. 61-131,307 a method for manufacturing a superconducting wire from a metal type superconducting material which is apt to be oxidized and very fragile such as PbMo$_{0.35}$Sg, comprising charging the material metal powder in a metal shell, extruding the metal shell filled with the material powder at a temperature of higher than 1,000° C., and then drawing the extruded composite. This metal working technique, however, cannot apply directly to ceramic material consisting of compound oxide, because the compound oxide type superconducting materials cannot exhibit the superconductivity if the specified or predetermined crystal structure is not realized. In other words, a superconducting wire which shows higher critical temperature and higher critical current density and which is useable in actual applications cannot be obtained outside predetermined optimum conditions. In particular, if the shell is not selected from proper materials, the resulting compound oxide will be reduced due to chemical reaction with the metal of the shell, resulting in poor or inferior properties of superconductivity.

In addition, the above-mentioned sintered ceramic materials must be shaped into an elongated structure when they are used as a superconducting wire. However, the above-mentioned superconducting materials obtained in a form of a sintered body are very fragile and are apt to be broken or cracked even under very weak mechanical stress. And hence, when they are shaped into a wire, special attention must be paid to their handling to insure that they will not be broken.

Further, although a variety of new ceramics such as AlN, Si$_3$N$_4$, Al$_2$O$_3$ or the like are utilized in many applications because of their superior heat resistance and mechanical properties, it has not been easy to produce a wire of ceramic. It has been the general practice of ceramic molding for manufacturing an elongated article such as wires or rods to add an organic binder to the material powder of ceramic so that a mixture of the powder material and the organic binder is shaped into a rod by means of an extruder or a press machine and then the shaped rod is passed directly or through a trimming or cutting stage to an intermediate sintering stage to remove the organic binder before it is fed to the final sintering stage.

The combination of the above-mentioned press-molding and trimming or cutting operations would result in the loss of great amounts of expensive ceramics material, and a dimensional ratio of longitudinal direction to cross sectional direction of the rod would not be increased. Therefore, this process cannot be used in practice because of waste of material and lower productivity.

The extrusion technique is much better than the press-molding technique in the economy of material and productivity but requires great quantities of organic binder added to the powder material. This organic binder is difficult to be removed completely during the intermediate sintering stage and hence remains in the finally sintered article, resulting in a cause of defects of the product which will lower the strength and the resistance to flexion.

A polycrystal having completely uniform crystal structure cannot be obtained from particles having superconducting properties along. Furthermore, the phenomenon of superconductivity is apt to be easily broken in a stronger magnetic field and under the fluctuation or unhomogeneous distribution of temperature in the sintered body, as well as the above-mentioned oxide type superconducting materials possessing rather higher specific resistance and lower heat-conductivity above the critical temperature. Therefore, if the phenomenon of superconductivity breaks locally, the sintered body produces Joule heat caused by the superconducting current preserved therein, and explosive evaporation of cryogen is induced when the heated portion of the sintered body comes in contact with the cryogen. In order to avert this danger, in conventional metal type superconducting material, superconducting metal is shaped in a form of a fine wire or filament, a plurality of which is embedded in electroconductive metal which plays a role of a by-pass of electric current when superconductivity breaks.

The oxide type superconducting materials are, however, difficult to be shaped or formed into such filaments, because they contain insufficient plasticity or processability in comparison with well-known metal type superconducting materials such as Ni-Ti alloy.

In order to realize a reliable and practical superconducting structure, it is essential that the structure possess enough strength and tenacity to sufficiently to endure bending force during usage and which also has a finer cross sectional dimension in such manner that it can transmit currency at higher critical current density and at higher critical temperature. However, conventional techniques cannot or are difficult to produce wire shaped ceramic articles possessing satisfactory mechanical strength and tenacity as well as a higher dimensional ratio of length to cross section.

Taking the abovementioned situation into consideration, the present inventors have proposed processes for producing sintered ceramic wires having a practically usable higher dimensional ratio of length to cross section without using organic binder, which is a cause of deterioration of strength and tenacity in U.S. patent application Ser. No. 152,713 titled "Process for Manufacturing a Superconducting Wire of Compound Oxide-Type Ceramic" filed Feb. 5, 1988 and Ser. No. 161,480 titled "Process for Manufacturing a Compound Oxide-Type Superconducting Wire" filed Feb. 28, 1988 in which a metal pipe filled with material powder is subjected to plastic deformation such as a wire-drawing technique by means of a die, and then is sintered.

These solutions are in themselves satisfactory but remain such problems that the resulting wire has a tendency to be broken due to relatively lower strength. The present inventors have continued to develop an improved wire-drawing process which can produce a ceramic wire possessing higher strength and no breakage which will complete the present invention.

Therefore, an object of the present invention is to overcome the above-mentioned problems of the conventional technique and to provide an improved process for producing a superconducting wire which has a higher Tc and higher stability as superconductor and which also has a higher degree of freedom in configuration so that it can be applicable to a practical use.

SUMMARY OF THE INVENTION

The present invention provides an improvement in a process for producing a sintered ceramic wire comprising filling a metal pipe with a material powder of ceramic, wire-drawing the metal pipe filled with the material powder and then subjecting a composite of the metal pipe and the material powder to heat-treatment to sinter the ceramic powder, characterized in that said wire-drawing is performed by roller dies.

BRIEF DESCRIPTION OF THE DRAWINGS

In FIG. 1, a metal pipe 2 filled with ceramic powder is passed through a pair of rollers 1A and 1B of the roller die 1.

DESCRIPTION OF PREFERRED EMBODIMENTS

Figure 1:
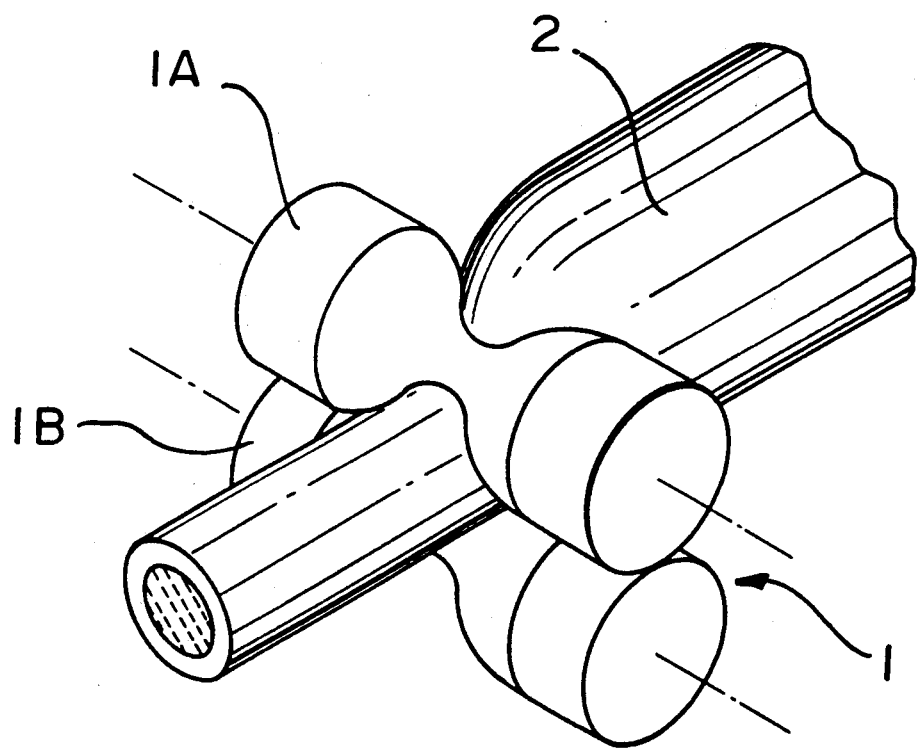
FIG. 1 illustrates a roller die which can be used in the process of the present invention.

According to one preferred embodiment, after the metal pipe filled with the material powder is wire-drawn by the roller dies, the resulting composite is subjected to intermediate sintering and then is further wire-drawn by the roller dies before the ceramic powder is sintered. The sequence of the first wire-drawing, intermediate sintering and the second wire-drawing may be repeated for desired time before the ceramic powder is sintered.

The resulting sintered ceramic wire obtained by the above-mentioned process has a thin outer metal layer of the pipe. This thin outer metal layer can be removed when the product is required to possess inherent properties of ceramics, for example, corrosion resistance or abrasion resistance, but may be kept as it is when the sintered ceramic wire is used as a composite material. Selection of removal or retention of the outer metal layer depends on application and the kind of metals used.

Therefore, according to another preferred embodiment of the present invention, after the intermediate sintering and the wire-drawing by the roller dies are completed, said outer metal pipe is removed before said ceramic powder is sintered in order to prevent chemical reaction between the metal pipe and the ceramic material powder during the sintering operation at high temperature.

It is also possible to remove the outer metal layer after the composite is subjected to a series of operations of the intermediate sintering, wire-drawing by the roller dies and further intermediate sintering. This further intermediate sintering is preferable to increase the strength of a mass of ceramic powder which is passed to a following outer metal removal stage and then followed by the final sintering stage, so that the mass of the ceramic powder can maintain its configuration during these stages.

The metal pipe used in the present invention is preferably made of metal which can be worked easily. When removal of the outer thin metal layer is desired, it can be removed mechanically, for example by grinding work. Therefore, the metal pipe is preferably made of at least one of metals selected from a group of copper, iron, nickel, cobalt and alloys containing at least one of copper, iron, nickel and cobalt as a bsae.

According to another aspect of the present invention, the metal pipe is preferably made of silver, since silver does not deteriorate compound oxide type superconductors the properties of which are susceptible to change by oxygen contents. Therefore, when a superconducting ceramic wire is produced according to the present invention, it is preferable to use a pipe made of silver.

The material powder to be filled in the metal pipe can be selected from a wire variety of ceramic powders. In case of compound oxide type superconducting wires, the material powder is a powder mixture consisting of a powder of a compound of an element $\alpha$ selected from IIb group of the Periodic Table, a powder of a compound of an element $\beta$ selected from IIa group of the Periodic Table and a powder of a compound of an element $\gamma$ selected from a group comprising Ib, IIb, IIIa, IVb and VIII group of the Periodic Table.

Each of said powder of compounds of elements $\alpha$, $\beta$ and $\gamma$ may be a powder of oxide, fluoride or carbonate of said elements, $\alpha$, $\beta$ and $\gamma$ respectively. It is also preferable to use, as each of said powder of compounds of elements $\alpha$, $\beta$ and $\gamma$, a sintered powder which is prepared by pulverizing a sintered body obtained by sintering the above-mentioned oxide, fluoride or carbonate of said elements $\alpha$, $\beta$ and $\gamma$ respectively. The sintering operation of the mixture of these compounds and pulverization operation are preferably repeated several times in order to obtain the compound oxide having a finer and homogeneous structure, so that the resulting product shows reduced discrepancy between the onset temperature and the critical temperature of superconductivity in order to permit the use of liquidized nitrogen which is available cheaply as cryogen.

It is also preferable to granulate the material powder of ceramic beforehand to facilitate compacting of the material powder into the metal pipe and to realize higher packing density if compacting of the powder in the metal pipe is difficult.

In case of compound oxide type superconducting materials, the property of superconductivity is influenced greatly by oxygen deficiency in the material in addition to crystal structure of the material. Therefore, in order to obtain the proper superconducting property, proportions of component powders in the powder mixture and oxygen contents in the sintered body are selected to satisfy the following general formula:

$$(\alpha_{1-x}\beta_x)\gamma_y O_z$$

in which "$\alpha$" stands for an element selected from elements of IIIb group of the Periodic Table, "$\beta$" stands for an element selected from elements of IIa elements of the Periodic Table, "$\gamma$" stands for an element selected from elements of Ib, IIb, IIIa, VIII and IVb group the Periodic Table, and small letters "x", "y" and "z" are numbers which satisfy $0.1 \leq X \leq 0.9$, $0.1 \leq y \leq 4.0$ and $1 \leq z \leq 5$.

An essential feature of the present invention resides in that the wire-drawing work is performed by roller dies. Namely, if the metal pipe filled with ceramic powder is drawn through an ordinary stationary die, breakage of a wire is apt to occur due to axial stress. To the contrary, no or little breakage of wire occurs when roller dies are used to draw the metal pipe filled with ceramic powder since the wire-drawing work by roller dies belongs to a category of rolling work in which breakage due to axial stress is difficult to occur.

It is preferable to sinter intermediate the composite obtained, after the metal pipe filled with the material powder is wire-drawn by the roller dies and then further wire-drawn by the roller dies. The sequence of the first wire-drawing, the intermediate sintering and the second wire-drawing may be repeated for desired time.

Generally speaking, the temperature at which the sintering of powders of compound oxide is performed is below a melting point of the sintered body which is the upper limit and is preferably above a temperature which is 100° C. lower than the melting point. If the sintering temperature, is lower than the temperature which is 100° C. lower than the melting point, satisfactory sintering reaction cannot be achieved, and hence the resulting product will not have practical strength. To the contrary, if the sintering temperature exceeds the upper limit of melting point, liquid phase will be produced so that the sintered body melts or decomposes, resulting in lowering the Tc. Generally, the sintering may be carried out at a temperature ranging from 700° to 1,000° C. which is selected in the function of the constituent elements of the ceramics.

It is also preferable to cool the sintered composite obtained by the final sintering at a rate of less than 10° C./min in order to realize improved crystal structure as superconductor.

The process for producing the superconducting wire according to the present invention is applicable to any kind of known sintered compound oxides such as Ba-Y-Cu type, Ba-La-Cu type, Sr-La-Cu type, Ca-Sr-Bi-Cu type or Tl-Ba-Ca-Cu type compound oxides.

In case of Ba-Y-Cu type compound oxides, a proportion of from 10 to 80% of Ba may be substituted by one or two elements selected from a group comprising Mg, Ca and Sr and/or a proportion of from 10 to 80% of Y may be substituted by one or two elements selected from a group comprising Sc, La and lanthanid. If the proportions of the substituents fall outside of the above-mentioned range of from 10 to 80%, no improvement of superconductivity is expected.

According to the present invention, higher dimensional ratio of longitudinal direction to cross sectional direction of the wire of more than 30 can be selected without substantial loss of mechanical strength and tenacity of the wire.

Now, the process according to the present invention will be described with reference to illustrative Examples, but the scope of the present invention should not be limited thereto.

EXAMPLE 1

Each of twenty pipes made of iron having a length of 1 m, an outer diameter of 5 mm and an inner diameter of 4 mm was filled with a powder of AlN having particle size of 100 mesh-under, and opposite ends of the pipe were closed. Then, each iron pipe was passed through a series of roller dies to reduce its outer diameter to the final value of 2.0 mm under such conditions that the dimensional reduction ratio in cross sectional direction per one unit block was equal to 37%. All samples showed no breakage.

As a comparison, another 20 iron pipes were passed through a series of conventional stationary dies in 20 unit blocks, each having a center hole which decreases in diameter gradually to obtain the final diameter of 2.0 mm under such conditions that the dimensional reduction ratio in cross sectional direction per one unit block was equal to 19%. In this case, breakage of pipes was observed at such frequencies as is shown in Table 1.

TABLE 1

| Diameter when breakage occurred | Frequency of breakage |
| --- | --- |
| No breakage up to 2.0 mm | 4 |
| before 2.0 mm | 9 |
| before 2.2 mm | 5 |
| before 2.4 mm | 2 |

Both of the samples according to the present invention and the samples which could be drawn up to the final diameter of 2.0 mm without any breakage according to the conventional stationary dies were sintered at 1,400° C. for 2 hours. Then, after the outer iron sheath was removed with acid, an intermittently sintered ceramic mass was subjected to the final sintering at 2,000° C. for 1 hour. The resulting sintered wires showed the deflective strength of 41.3 kg/cm$^2$ (see the sample of present invention) and 39.7 kg/cm$^2$ (see sample of the comparative example) respectively.

EXAMPLE 2

20.8% by weight of commercially available Y$_2$O$_3$ powder, 54.7% by weight of commercially available BaCO$_3$ and 24.5% by weight of commercially available CuO were mixed in an wet mixer and then dried. The dried powder was sintered at 880° C. in air for 24 hours and then was pulverized and passed through a sieve to obtain powder of 100 mesh-under. The above-mentioned operations from the sintering to sieving were repeated for three times.

After treatment of granulation, the granulated material powder was compacted into an iron pipe having an outer diameter of 5 mm, an inner diameter of 4 mm and a length of 1 m, and opposite ends of the pipe were closed.

Each of 20 samples of the pipes filled with the material powder was passed through a series of roller dies to reduce their outer diameter down to 1.0 mm under such condition that the dimensional reduction ratio in cross sectional direction per one unit block was 38%. All samples showed no breakage.

As a comparison, another 20 samples of iron pipes filled with the same powder were passed through a series of conventional stationary dies to obtain the final diameter of 1.0 mm under such conditions that the dimensional reduction ratio in cross sectional direction per one unit block was 18%. In this case, breakage of pipes was observed at such frequencies as is shown in Table 2.

TABLE 2

| Diameter of pipe when breakage occurred | Frequency of breakage |
| --- | --- |
| No breakage occurred up to 1.0 mm | 1 |
| Breakage occurred between 1.0 mm and 1.1 mm | 8 |
| Breakage occurred between 1.2 mm and 1.5 mm | 7 |
| Breakage occurred between 1.65 mm and 2.0 mm | 3 |
| Breakage occurred between 2.0 mm and 2.4 mm | 1 |

Of the five samples according to the present invention only one sample cold be drawn up to a diameter of 1.0 mm without any breakage.

Then, reduction in cross section of the pipe was repeated by the roller dies (in case of the present invention) and by the stationary dies (in case of the comparative example) to obtain an outer diameter of 0.3 mm. The result revealed that the five samples of the present invention could be drawn up to the final diameter of 0.3 mm, while the one sample of the comparative example broke at a diameter of 0.42 mm.

Then, all of the samples (the sample of the comparative example which broke at a diameter of 0.42 mm and the samples of the present invention which could be drawn up to the final diameter of 0.3 mm) were subjected to the final sintering at 930° C. for 3 hours. Measurement of the critical temperature (Tc) of the resulting sintered wires revealed that the sample of the comparative example produced by the stationary die possessed the Tc of 46K, while the samples produced by the roller dies according to the invention possessed Tc of 56K.

EXAMPLE 3

20.8% by weight of commercially available Y$_2$O$_3$ powder, 54.7% by weight of commercially available BaCO$_3$ and 24.5% by weight of commercially available CuO were mixed in a wet mixer and then dried. The dried powder was sintered at 880° C. in air for 24 hours and then was pulverized and passed through a sieve to obtain powder of 100 mesh-under. The above-mentioned operations from the sintering to screening were repeated three times.

After treatment of granulation, the granulated material powder was compacted into a silver pipe having an outer diameter of 5 mm, an inner diameter of 4 mm and a length of 1 m, and opposite ends of the pipe were closed.

Each of 20 samples of the silver pipes filled with the material powder was passed through a series of roller dies to reduce its outer diameter down to 1.0 mm under such condition that the dimensional reduction ratio in cross sectional direction per one unit block was 38%. All samples showed no breakage.

As a comparison, another 20 samples of silver pipes were passed through a series of conventional stationary dies having a central hole to obtain the final outer diameter of 1.0 mm under such condition that the dimensional reduction ratio in cross sectional direction per one reduction unit block was 18%. In this case, breakage of pipes was observed at such frequencies as is shown in Table 3.

TABLE 3

| Diameter when breakage occurred | Frequency of breakage |
| --- | --- |
| No breakage occurred up to 1.0 mm | 1 |
| Breakage occurred between 1.0 mm and 1.1 mm | 8 |
| Breakage occurred between 1.2 mm and 1.5 mm | 7 |
| Breakage occurred between 1.65 mm and 2.0 mm | 3 |
| Breakage occurred between 2.0 mm and 2.4 mm | 1 |

Of the five samples according to the present invention only one sample could be drawn up to a diameter of 1.0 mm without any breakage.

Then, reduction in cross section of the pipes was repeated by the roller dies (in case of the present invention) and by the stationary dies (in case of the comparative example) to obtain an outer diameter of 0.3 mm. The result revealed that the five samples of the present invention could be drawn up to the final diameter of 0.3 mm, while the one sample of the comparative example broke at a diameter of 0.42 mm.

Then, all of the samples (the sample of the comparative example which broke at a diameter of 0.42 mm and the samples of the present invention which were drawn to the final diameter of 0.3 m) were subjected to the final sintering at 930° C. for 3 hours. When the sintering was completed, the composite was cooled at a cooling rate of 10° C./min. Then, the critical temperature (Tc) was measured on the sample.

Measurement of the critical temperature was carried out by a conventional four-probe method in which, after electrodes were connected to the opposite ends of the resulting wire with conductive silver paste, the wire was immersed in liquidized hydrogen to cool the wire down to a temperature of 25K in a cryostat. The temperature is measured by a calibrated Au(Fe)-Ag thermocouple. Then, the temperature dependence of resistance of the sample was determined by raising the temperature gradually. The results revealed that the sample of the present invention exhibited superconductivity up to relatively higher temperature of 99K.

For comparison, the critical temperature of the sample of the comparative example prepared by the stationary dies was also measured. The result revealed that the critical temperature of the comparative example is 20K lower than the critical temperature of the sample according to the present invention. This discrepancy might be caused by fine cracks produced inside the ceramic wire. This fact was also supported by measurement of current density in which the sample obtained by the roller dies showed higher critical density than the sample prepared by the stationary dies.

What we claim are:

1. A process for producing a sintered composite wire, comprising:
   (a) filling a metal pipe with a ceramic powder;
   (b) wire-drawing the metal pipe filled with said ceramic powder using roller dies;
   (c) subjecting said drawn composite to intermediate sintering;
   (d) further drawing the sintered composite, using roller dies;
   (e) repeating steps (b), (c) and (d) at least twice; and
   (f) subjecting the composite to a heating operation to sinter said ceramic powder.

2. A process set forth in claim 1 wherein said metal pipe is made of at least one of metals selected from the group consisting of copper, iron, nickel, cobalt and alloys containing at least one of copper, iron, nickel and cobalt as a base.

3. A process set forth in claim 1 wherein, after the composite is subjected to the intermediate sintering and then to the wire-drawing by the roller dies, said outer metal pipe is removed before said ceramic powder is sintered.

4. A process set forth in claim 1 wherein, after the composite is subjected to a series of operations of the intermediate sintering, wire-drawing by the roller dies and further intermediate sintering, said outer metal pipe is removed before said ceramic powder is sintered.

5. A process set forth in claim 1 wherein said metal pipe is removed after the ceramic powder is sintered.

6. A process set forth in claim 1 wherein each of said powder of compounds of elements $\alpha$, $\beta$ and $\gamma$ is a powder of oxide, fluoride or carbonate of said elements $\alpha$, $\beta$ and $\gamma$ respectively.

7. A process set forth in claim 6 wherein each of said powder of compounds of elements $\alpha$, $\beta$ and $\gamma$ is a sintered powder which is prepared by pulverizing a sintered body obtained by sintering oxide, fluoride or carbonate of said elements $\alpha$, $\beta$ and $\gamma$, respectively.

8. A process set forth in claim 1 wherein said material powder mixture is granulated previously.

9. A process set forth in claim 1 wherein said heating step is carried out at a temperature selected in a range of from an upper limit of the lowest melting point among said powder of compounds to a lower limit of a temperature which is 100° C. lower than said lowest melting point.

10. A process set forth in claim 1 wherein, after completion of the heating operation of said composite, said composite is cooled slowly.

11. A process set forth in claim 10 wherein, after completion of the heating operation of said composite, said composite is cooled at a cooling velocity of 10° C./min.

12. A process for producing a sintered composite wire, comprising:
   (a) filling a metal pipe with a ceramic powder;
   (b) wire-drawing the metal pipe filled with said ceramic powder, using roller dies;
   (c) subjecting said drawn composite to intermediate sintering;
   (d) further drawing the sintered composite, using roller dies;
   (e) repeating steps (b), (c) and (d) at least twice; and
   (f) subjecting the composite to a heating operation to sinter said ceramic powder;
wherein the resulting sintered wire obtained by the final sintering possesses superconducting property.

13. A process for producing a sintered composite wire, comprising:
   (a) filling a metal pipe with a ceramic powder;
   (b) wire-drawing the metal pipe filled with said ceramic powder, using roller dies;
   (c) subjecting said drawn composite to intermediate sintering;
   (d) further drawing the sintered composite, using roller dies;
   (e) repeating steps (b), (c) and (d) at least twice; and
   (f) subjecting the composite to a heating operation to sinter said ceramic powder;
wherein said ceramic is a compound oxide of Ba-Y-Cu.

14. A process for producing a sintered composite superconductive wire, comprising:

(a) filling a silver pipe within a ceramic material wherein the ceramic material is selected to satisfy the following general formula:

$$(\alpha_{1-x}\beta_x)\gamma_y O_z$$

Where $\alpha$ is a IIIb element, $\beta$ is a IIa element, $\gamma$ is a Ib, IIb, IIIa, VIII or IVb element,
$0.1 \leq x \leq 0.9$
$1.0 \leq y \leq 4.0$ and
$1 \leq z \geq 5$;

(b) wire-drawing the silver pipe filled with said ceramic material powder mixture, using roller dies;
(c) subjecting said drawn composite to intermediate sintering;
(d) further drawing the sintered composite, using roller dies;
(e) repeating steps (b), (c) and (d) at least twice; and
(f) subjecting the composite to a heating operation to sinter said ceramic material powder mixture.

15. A process set forth in claim 14 wherein said element $\beta$ is Ba, said element $\alpha$ is Y and said element $\gamma$ is Cu.

16. A process set forth in claim 15 wherein a proportion of from 10 to 80% of said element $\alpha$ is substituted by one or two elements selected from the group consisting of Mg, Ca, and Sr.

17. A process set forth in claim 15 wherein a proportion of from 10 to 80% of said element $\beta$ is substituted by one or two elements selected from the group consisting of Sc, La and lanthanide.

18. A process set forth in claim 14 wherein said element $\beta$ is Sr, said element $\alpha$ is La and said element $\gamma$ is Cu.

* * * * *